United States Patent
Kaneko et al.

(10) Patent No.: US 11,756,866 B2
(45) Date of Patent: Sep. 12, 2023

(54) LEAD FRAME AND SEMICONDUCTOR DEVICE

(71) Applicant: SHINKO ELECTRIC INDUSTRIES CO., LTD., Nagano (JP)

(72) Inventors: Kentaro Kaneko, Nagano (JP); Yoshio Furuhata, Nagano (JP); Konosuke Kobayashi, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 76 days.

(21) Appl. No.: 17/469,129

(22) Filed: Sep. 8, 2021

(65) Prior Publication Data
US 2022/0077028 A1 Mar. 10, 2022

(30) Foreign Application Priority Data
Sep. 10, 2020 (JP) .................. 2020-152327

(51) Int. Cl.
*H01L 23/495* (2006.01)
*H01L 21/48* (2006.01)

(52) U.S. Cl.
CPC .... *H01L 23/49513* (2013.01); *H01L 21/4828* (2013.01); *H01L 23/49548* (2013.01)

(58) Field of Classification Search
CPC ................ H01L 21/4828; H01L 23/3107
USPC .......................................... 257/676
See application file for complete search history.

(56) References Cited

U.S. PATENT DOCUMENTS 10,522,446 B2 * 12/2019 Nishikizawa ........... H01L 24/32
2007/0284733 A1 * 12/2007 Leung ................. H01L 23/3677
257/E23.105

FOREIGN PATENT DOCUMENTS

JP  2013-058542  3/2013
JP  2014-203861  10/2014

* cited by examiner

Primary Examiner — Caleb E Henry
Assistant Examiner — Dilinh P Nguyen
(74) Attorney, Agent, or Firm — Rankin, Hill & Clark LLP

(57) ABSTRACT

A lead frame includes: a die pad having a mounting surface for a semiconductor element; a recess included on the mounting surface; and a lead disposed around the die pad. The recess includes: a bottom surface positioned at a depth less than a thickness of the die pad from an opening plane of the recess; a plurality of protrusions protruding from the bottom surface; and a concavity recessed from the bottom surface.

20 Claims, 14 Drawing Sheets

LEAD FRAME AND SEMICONDUCTOR DEVICE

CROSS-REFERENCE TO RELATED APPLICATION

This application is based upon and claims the benefit of priority of the prior Japanese Patent Application No. 2020-152327, filed on Sep. 10, 2020, the entire contents of which are incorporated herein by reference.

FIELD

The present invention relates to a lead frame, a semiconductor device, and a manufacturing method of a lead frame.

BACKGROUND

In recent years, semiconductor devices, in which a semiconductor element such as an integrated circuit (IC) chip is mounted on a metal lead frame, are known. That is, for example, a semiconductor element is mounted on a planar die pad included at the center of a lead frame, and this semiconductor element is coupled to a plurality of leads provided around the die pad by, for example, wire bonding. Then, the semiconductor element mounted on the lead frame may be encapsulated with resin such as epoxy resin to form a semiconductor device.

In such a semiconductor device, a semiconductor element is generally bonded to the die pad by, for example, solder or die attach paste. Since a bonding material such as solder or die attach paste may flow out to the periphery of a bonding area of a semiconductor element on the die pad, it is conceivable that a groove is formed around the bonding area to prevent the bonding material from flowing out.

Patent Literature 1: JP 2014-203861 A

Patent Literature 2: JP 2013-058542 A

However, in a case where a bonding material is prevented from flowing out, there is a problem that the forming step of a lead frame is complicated. That is, for example, as described above, in the case of forming a groove around a bonding area, a process of forming a groove in a die pad is performed after forming the die pad of the lead frame, and thus the number of steps of forming the lead frame increases. On the other hand, if a structure that prevents the bonding material from flowing out is not included, the bonding material may flow out to the periphery of the die pad, and the wire bonding of the semiconductor element is hindered, or the reliability of the semiconductor device is lowered.

SUMMARY

According to an aspect of an embodiment, a lead frame includes: a die pad having a mounting surface on which a semiconductor element is mounted; a recess included on the mounting surface; and a lead disposed around the die pad. The recess includes: a bottom surface positioned at a depth less than a thickness of the die pad from an opening plane of the recess; a plurality of protrusions protruding from the bottom surface; and a concavity recessed from the bottom surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
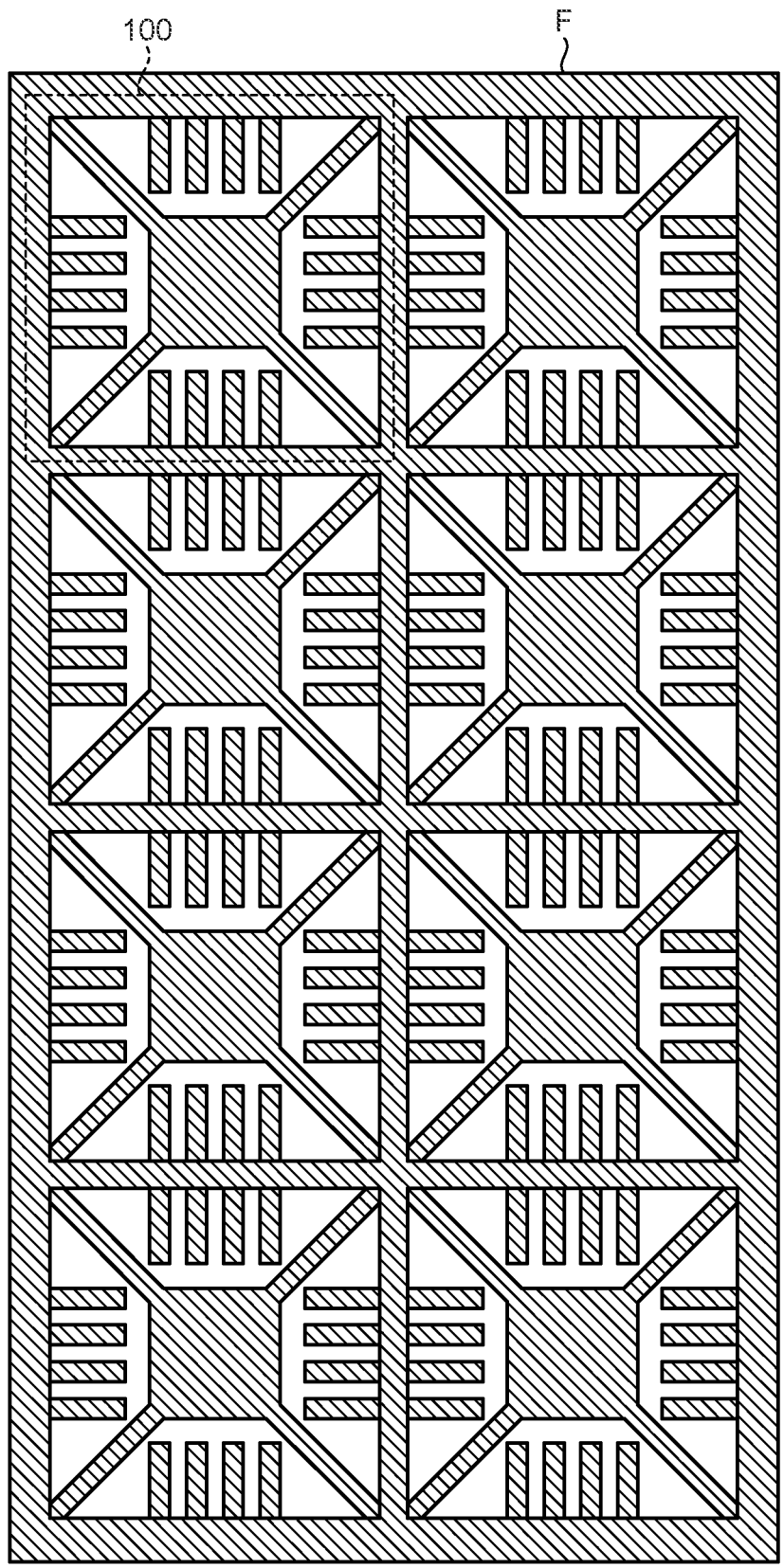
FIG. 1 is a diagram illustrating a specific example of a lead frame aggregation according to an embodiment.

Hereinafter, embodiments of a lead frame, a semiconductor device, and a manufacturing method of a lead frame disclosed in the present application will be described in detail by referring to the drawings. Note that the present invention is not limited by the embodiments.

FIG. 1 is a diagram illustrating a specific example of an aggregation of lead frames 100 according to an embodiment; As illustrated in FIG. 1, lead frames 100 are manufactured as an aggregation in which a plurality of lead frames 100 are coupled in an area surrounded by a frame body F. In the example illustrated in FIG. 1, for example, etching and plating are performed using a metal plate of copper or a copper alloy as a material to manufacture eight lead frames 100 coupled in four rows by two columns.

By manufacturing an aggregation of a plurality of lead frames 100 in this manner, the lead frames 100 can be efficiently manufactured, and the cost can be reduced. The plurality of lead frames 100 manufactured as an aggregation is divided into each piece to obtain a lead frame 100 on which electronic components such as a semiconductor element is mounted. The outer shape of one piece of the divided lead frames 100 is, for example, a square having one side of 70 mm and a thickness of 0.1 to 0.25 mm.

Figure 2A:
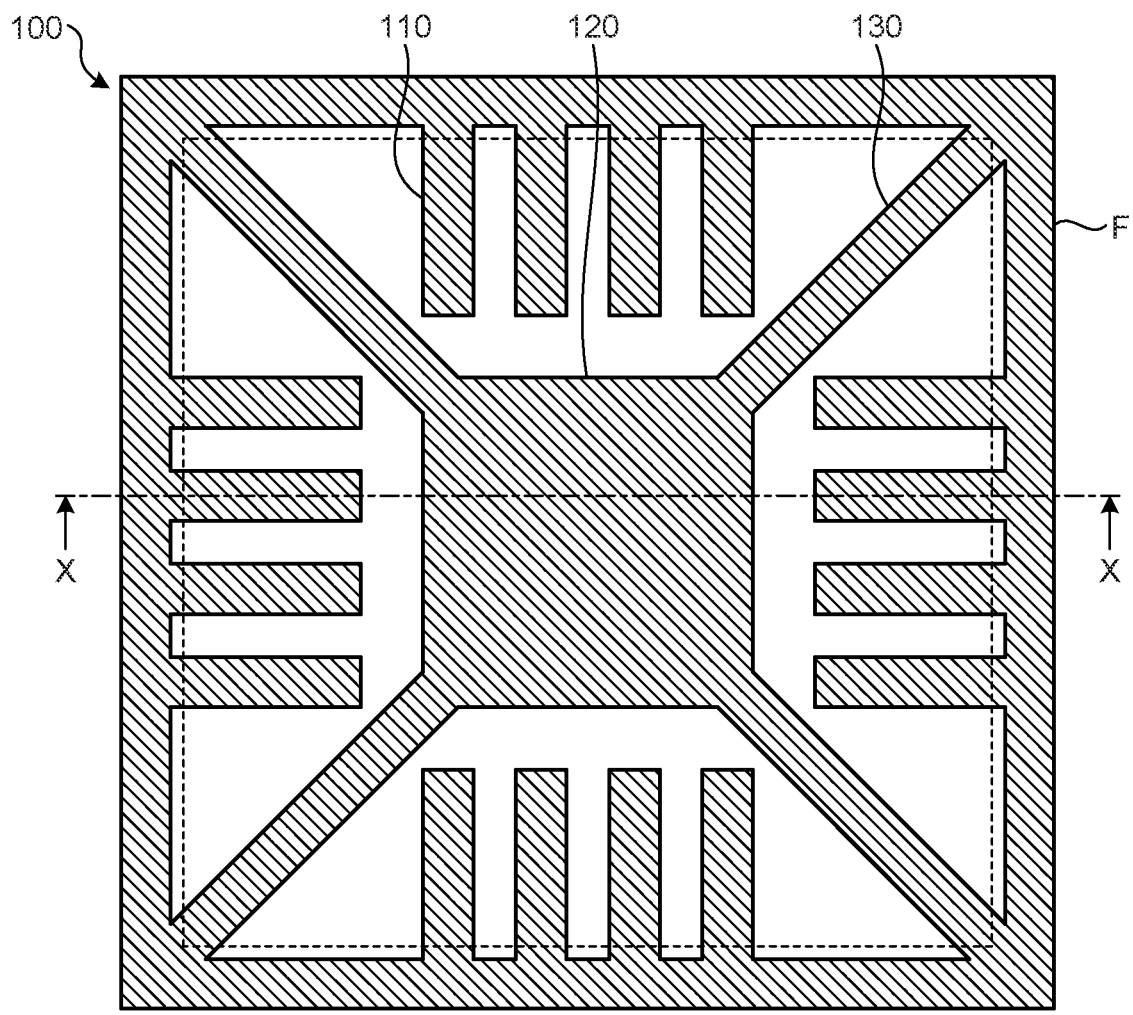
FIGS. 2A and 2B are diagrams illustrating a structure of a lead frame according to an embodiment.
Figure 2B:
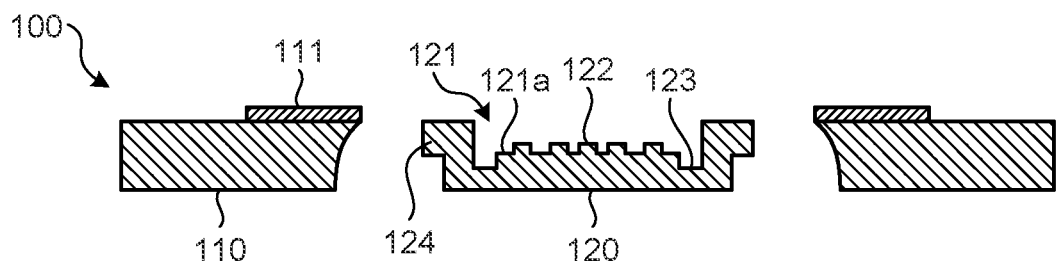

FIGS. 2A and 2B are diagrams illustrating the structure of one lead frame 100. That is, FIG. 2A is a plan view of the lead frame 100, and FIG. 2B is a cross-sectional view taken along line X-X of FIG. 2A.

The lead frame 100 includes a plurality of leads 110, a die pad 120, and coupling portions 130. As illustrated in FIG. 2A, each of the plurality of leads 110 extends from the frame body F toward the die pad 120, and the die pad 120 is coupled to the frame body F by the coupling portion 130. Moreover, as illustrated in FIG. 2B, the upper side of the leads 110 and the upper side of the die pad 120 are positioned in the same plane, and the lower side of the leads 110 and the lower side of the die pad 120 are positioned in the same plane. That is, the leads 110 and the die pad 120 have the same thickness. Note that when a semiconductor device is formed using the lead frame 100, the lead frame 100 is cut at a broken line in FIG. 2A, and thereby the leads 110 and the coupling portion 130 are separated from the frame body F.

When an electronic component such as a semiconductor element is mounted on the lead frame 100, a lead 110 forms a terminal that electrically couples the electronic component and an external component. On the upper side of the lead frame 100 on which a semiconductor element is mounted, a plating layer 111 is formed on the leads 110. In a case where a semiconductor element is mounted on the lead frame 100, the semiconductor element is coupled to the plating layer 111 by wire bonding. Then, when the semiconductor element mounted on the lead frame 100 has been molded with an encapsulating resin to form a semiconductor device, the lower side and sides of the leads 110 that are cut from the frame body F are exposed from the encapsulating resin to form terminals of the semiconductor device.

The die pad 120 is a plate-like area formed at the center of the lead frame 100 and is coupled to the frame body F by, for example, four coupling portions 130. A semiconductor element is mounted on the die pad 120. Specifically, a recess 121 having a depth less than the thickness of the die pad 120 is formed at the center of the die pad 120, and the semiconductor element is mounted in the recess 121. A bottom surface 121a of the recess 121 is positioned at a depth less than the thickness of the die pad 120 from the opening plane of the recess 121, and the bottom surface 121a includes a plurality of protrusions 122 protruding upward from the bottom surface 121a and is formed with a concavity 123 recessed downward than the bottom surface 121a. In addition, a flange 124 protruding laterally is formed outside the area where the recess 121 is formed.

A protrusion 122 is formed by a part of the bottom surface 121a protruding to a position shallower than the bottom surface 121a. That is, the upper end of the protrusion 122 is positioned above the bottom surface 121a and below the upper side of the die pad 120. The protrusions 122 improve adhesion of a bonding material such as solder or die attach paste for bonding the lower side of the semiconductor element and the bottom surface 121a when the semiconductor element is mounted in the recess 121. That is, the bottom surface 121a is roughened by formation of the protrusions 122, and the bonding material is brought into close contact with the bottom surface 121a on which the protrusions 122 are formed.

The concavity 123 is formed by the peripheral edge of the bottom surface 121a being depressed to a position deeper than the bottom surface 121a. That is, the bottom of the concavity 123 is positioned below the bottom surface 121a and above the lower side of the die pad 120. The concavity 123 accommodates the bonding material that is in excess and prevents the bonding material from overflowing from the recess 121 when the semiconductor element is mounted in the recess 121. That is, by formation of the concavity 123, the excessive bonding material supplied into the recess 121 flows to the concavity 123 and is accommodated, and the bonding material is prevented from flowing toward outside of the recess 121.

The flange 124 is formed by an upper portion, of the outer circumference surrounding the recess 121, protruding toward the leads 110. The flange 124 prevents the lead frame 100 from falling off from the encapsulating resin when the lead frame 100 and the semiconductor element are molded with the encapsulating resin. That is, by formation of the flange 124, the encapsulating resin is filled in the notch below the flange 124, and thus the bonding strength between the lead frame 100 and the encapsulating resin is improved.

The recess 121, the protrusions 122, the concavity 123, and the flange 124 are formed simultaneously when the leads 110 and the die pad 120 are separated and formed by etching. Specifically, when the leads 110 and the die pad 120 are separated by etching, the recess 121 is formed by performing half etching from the upper side of the die pad 120. Similarly, by performing half etching from the lower side of the die pad 120, a portion below the flange 124 is cut out, thereby forming the flange 124. Furthermore, when half etching is performed from the upper side of the die pad 120, positions corresponding to the protrusions 122 are protected by the resist, and thereby etching of the resist portions is suppressed, and the protrusions 122 are formed. Then, by adjustment of the density of the resist for forming the protrusions 122, the concavity 123 is formed in an area where the density of the resist is sparse. A method for forming the recess 121, the protrusions 122, the concavity 123, and the flange 124 will be described in detail later.

Figure 3:
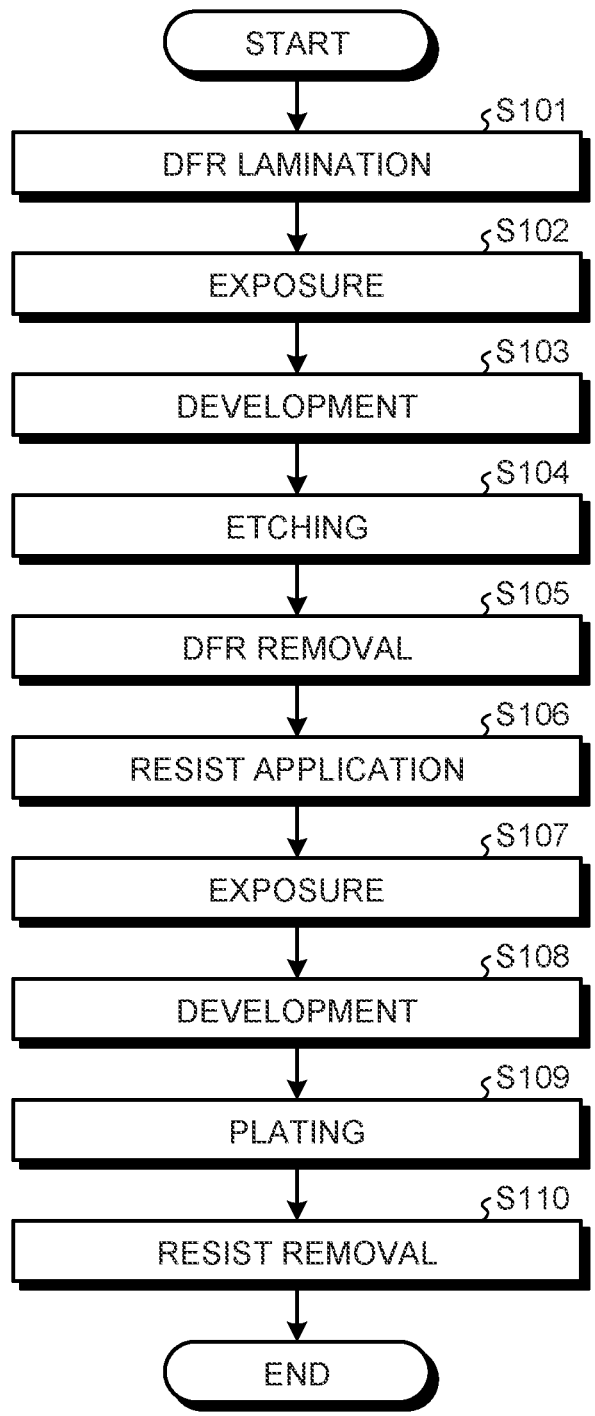
FIG. 3 is a flowchart illustrating a manufacturing method of a lead frame.

Next, a manufacturing method of the lead frame 100 structured as described above will be specifically described with examples by referring to the flowchart illustrated in FIG. 3. The steps described below are performed on an aggregation of, for example, the lead frames 100 as illustrated in FIG. 1; however, hereinafter, a specific example of each step will be described focusing on one lead frame 100.

Figure 4:
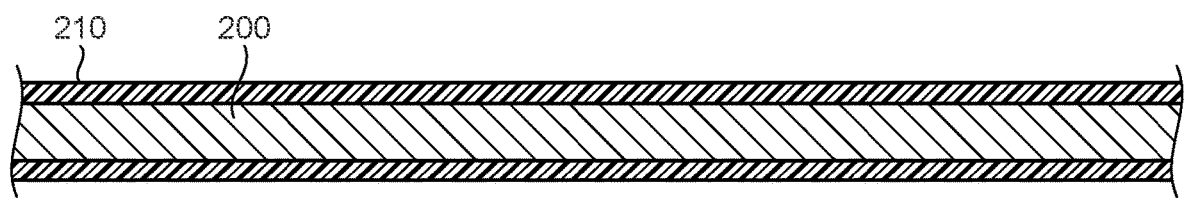
FIG. 4 is a diagram illustrating a specific example of a DFR lamination step.

First, a metal plate as a material is subjected to pretreatment such as cleaning, and then a dry film resist (DFR), which is an etching resist, is laminated on the surface of the metal plate (step S101). Specifically, for example as illustrated in FIG. 4, a DFR 210 is laminated on the upper side and the lower side of a metal plate 200 made of copper or a copper alloy having a thickness of 0.1 to 0.25 mm.

Figure 5:
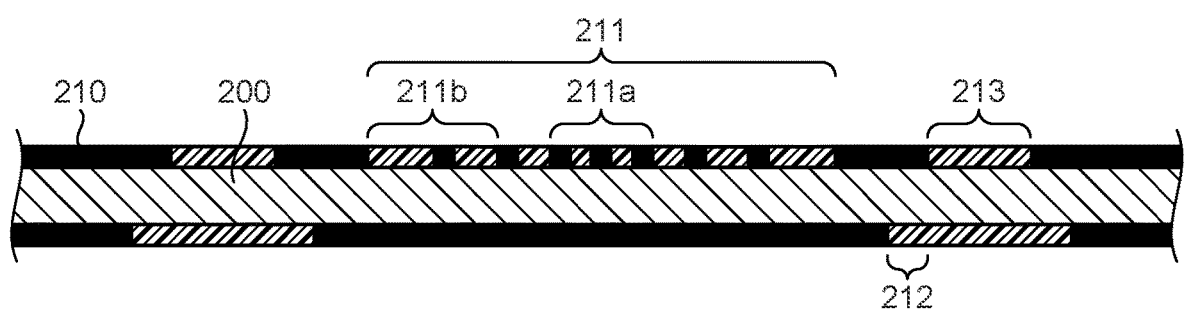
FIG. 5 is a diagram illustrating a specific example of an exposure step.

Then, a pattern mask is formed on the surface of the DFR 210 in accordance with the shape of the lead frame 100, and exposure is performed, thereby parts of the DFR 210 where the pattern mask is not formed is cured (step S102). Specifically, for example, as illustrated in FIG. 5, in an area 211 where the recess 121 is formed, the DFR 210 on the upper side is not cured, but the DFR 210 on the lower side is cured. In an area 212 where the flange 124 is formed, the DFR 210 on the upper side is cured, but the DFR 210 on the lower side is not cured. That is, in an area half-etched from one of the upper side and the lower side of the metal plate 200, the DFR 210 of one of the upper side and the lower side is cured, and the DFR 210 of the other side is not cured.

On the other hand, in areas 213 that separate the leads 110 and the die pad 120, the DFRs 210 are not cured on both the upper side and the lower side. That is, in an area etched from both the upper side and the lower side of the metal plate 200, the DFRs 210 of the upper side and the lower side are both not cured.

Note that, in FIG. 5, portions cured by exposure of the DFRs 210 are illustrated in black. The portions cured by exposure of the DFR 210 are remaining portions that remain after development.

Although the DFR 210 on the upper side is not cured in the area 211 where the recess 121 is formed, the DFR 210 is cured at portions corresponding to the protrusions 122. That is, remaining portions that are cured are interspersed in the DFR 210 on the upper side of the area 211. At this case, the density of the remaining portions that are interspersed varies depending on the position in the area 211. Specifically, the density of a remaining portion is high in a central portion 211a of the area 211, and the density of a remaining portion is low in peripheral portions 211b. In other words, the area of remaining portions per unit area is large in the central portion 211a of the area 211, and the area of remaining portions per unit area is small in the peripheral portions 211b. As described above, in the area 211, the density of remaining portions of the DFR 210 corresponding to the protrusions 122 is not uniform, and there are an area where the density of remaining portions is high and an area where the density of remaining portions is low.

Figure 6:
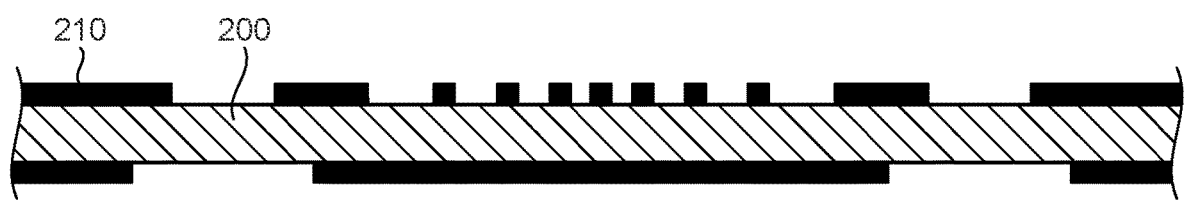
FIG. 6 is a diagram illustrating a specific example of a developing step.

When a DFR 210 is cured by exposure, development of the DFR 210 is performed (step S103), and only remaining portions that are cured remain on the surface of the metal plate 200. That is, for example, as illustrated in FIG. 6, the remaining portions of the DFR 210 covers the surface of the metal plate 200, and the metal plate 200 is exposed at parts other than the remaining portions. The metal plate 200 in which the remaining portions remain on the surface in this manner is immersed in an etching solution and etched (step S104). Specifically, for example, by immersion of the metal plate 200 in an etching solution such as sulfuric acid-hydrogen peroxide or persulfate, the surface of the metal plate 200 not covered with the remaining portions is dissolved and formed into the shape of the lead frame 100.

Figure 7:
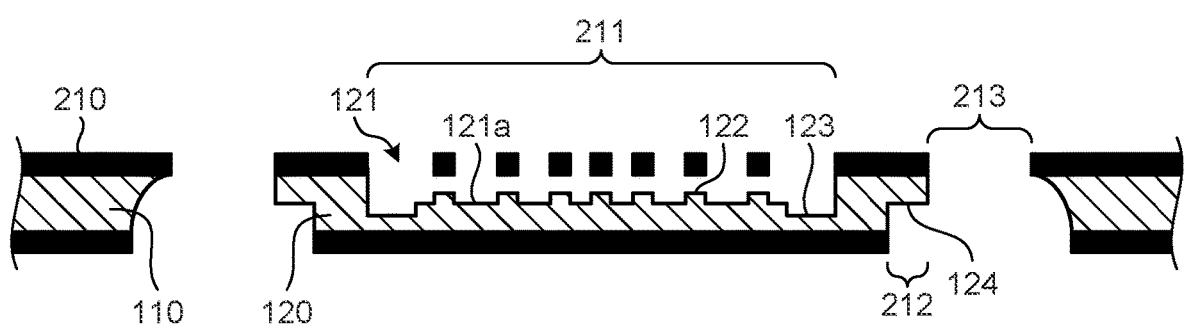
FIG. 7 is a diagram illustrating a specific example of an etching step.

That is, for example, as illustrated in FIG. 7, in the area 213 not covered with the remaining portions, the metal plate 200 is dissolved from the upper side and the lower side, and the lead 110 and the die pad 120 are separated from each other. In addition, in the area 211 where only the lower side is covered with a remaining portion, the metal plate 200 is dissolved from the upper side and half-etched, thereby forming the recess 121. Then, at the positions of the remaining portions interspersed in the area 211, the protrusions 122 are formed by etching from the periphery of the remaining portion. That is, at parts covered by remaining portions, etching is suppressed as compared with a part not covered by a remaining portion, and the protrusions 122, etched to a position shallower than the bottom surface 121a, are formed. Furthermore, since the density of the remaining portions is not uniform and the remaining portions are sparse at peripheral portions 211b of the area 211, etching at this portions are promoted. Therefore, the concavity 123 etched to a position deeper than the bottom surface 121a is formed. Furthermore, in the area 212 where only the upper side is covered with a remaining portion, the metal plate 200 is dissolved from the lower side and half-etched, thereby forming the flange 124.

In this manner, the leads 110 and the die pad 120 are separated by etching, and at the same time, the recess 121 and the flange 124 are formed in the die pad 120. In the recess 121, etching is performed to different depths depending on the density of the remaining portions of the DFR 210, and the protrusions 122 and the concavity 123 having depths from the opening plane of the recess 121 different from that of the bottom surface 121a are simultaneously formed.

Figure 8:
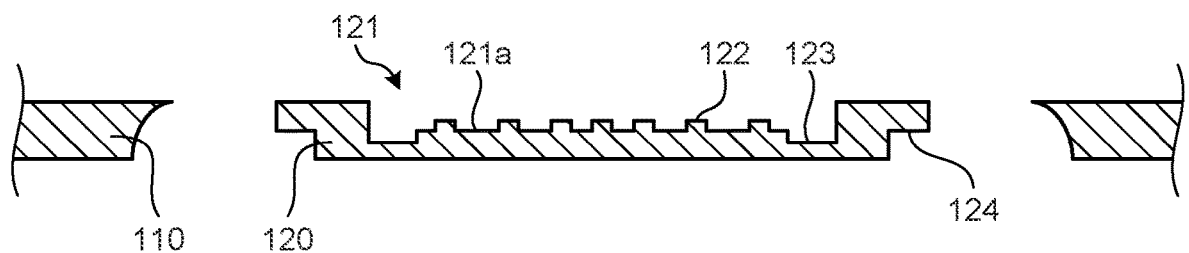
FIG. 8 is a diagram illustrating a specific example of a DFR removal step.

When the etching is completed, the DFR 210 is removed using, for example, an amine-based or non-amine-based removal solution (step S105), and the lead frame 100 having the leads 110 and the die pad 120 is obtained. That is, for example, as illustrated in FIG. 8, the leads 110 and the die pad 120 are separated, and the lead frame 100, in which the recess 121 and the flange 124 are formed in the die pad 120, is obtained. The protrusions 122 and the concavity 123 are formed on the bottom surface 121a in the recess 121.

In a case where the thickness of the metal plate 200 is, for example, 0.2 mm (200 µm), the depth from the uppermost surface of the die pad 120 (that is, the opening plane of the recess 121) to the bottom surface 121a is, for example, about 90 µm, and the depth to the end of the protrusion 122 is, for example, about 85 µm. Therefore, the height of the protrusions 122 from the bottom surface 121a is, for example, about 5 µm. Furthermore, the depth from the uppermost surface of the die pad 120 (that is, the opening plane of the recess 121) to the concavity 123 is, for example, about 110 to 120 µm. Therefore, the concavity 123 is recessed from the bottom surface 121a to a depth of about 20 to 30 µm.

Figure 9:
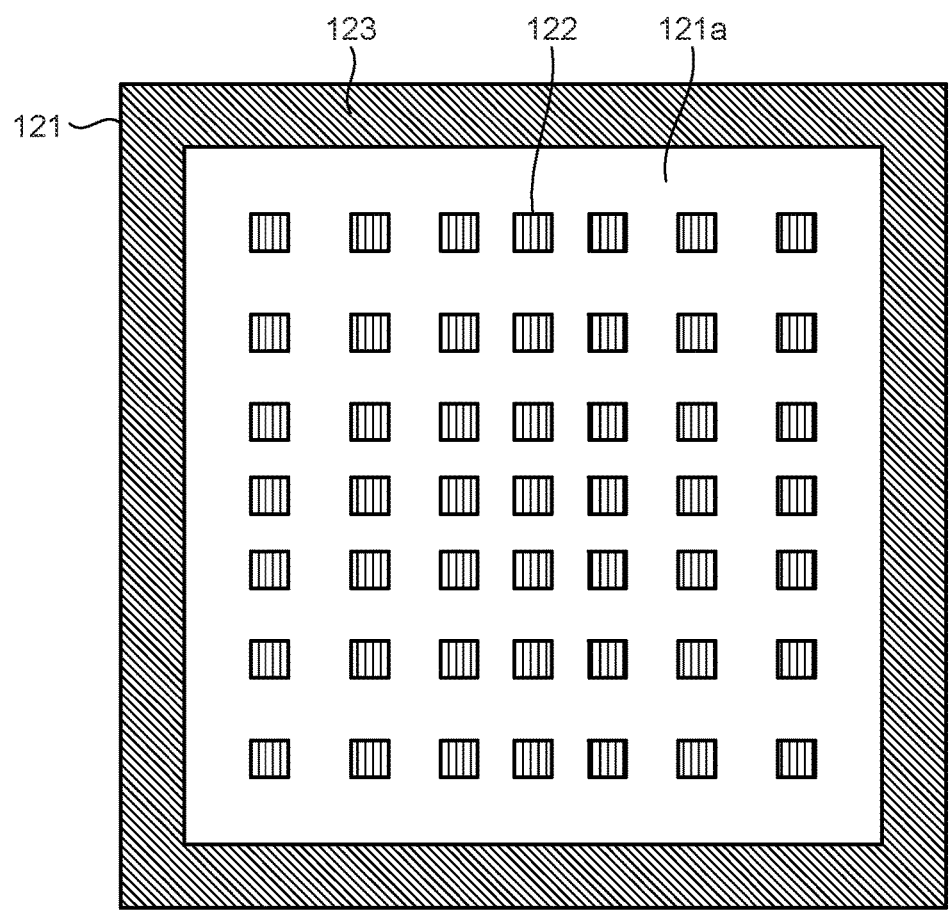
FIG. 9 is a plan view illustrating a specific example of a structure of a die pad.

Here, by adjustment of the density of the remaining portions of the DFR 210, the plurality of protrusions 122 are formed at a non-uniform density on the bottom surface 121a, and the concavity 123 is formed in the area where the protrusions 122 are sparse. That is, since protrusions 122 are densely formed at the central portion of the bottom surface 121a, and protrusions 122 are sparsely formed at the peripheral portion of the bottom surface 121a, the concavity 123 is formed at the peripheral portion of the bottom surface 121a. For example, as illustrated in FIG. 9, the density of the protrusions 122 is higher as it is closer to the center of the bottom surface 121a, and the density of the protrusions 122 is lower as it is closer to the periphery. Therefore, the concavity 123 is formed at the periphery of the bottom surface 121a where the density of the protrusions 122 is low. However, the arrangement of the protrusions 122 and the concavity 123 is not limited to that illustrated in FIG. 9.

Figure 10:
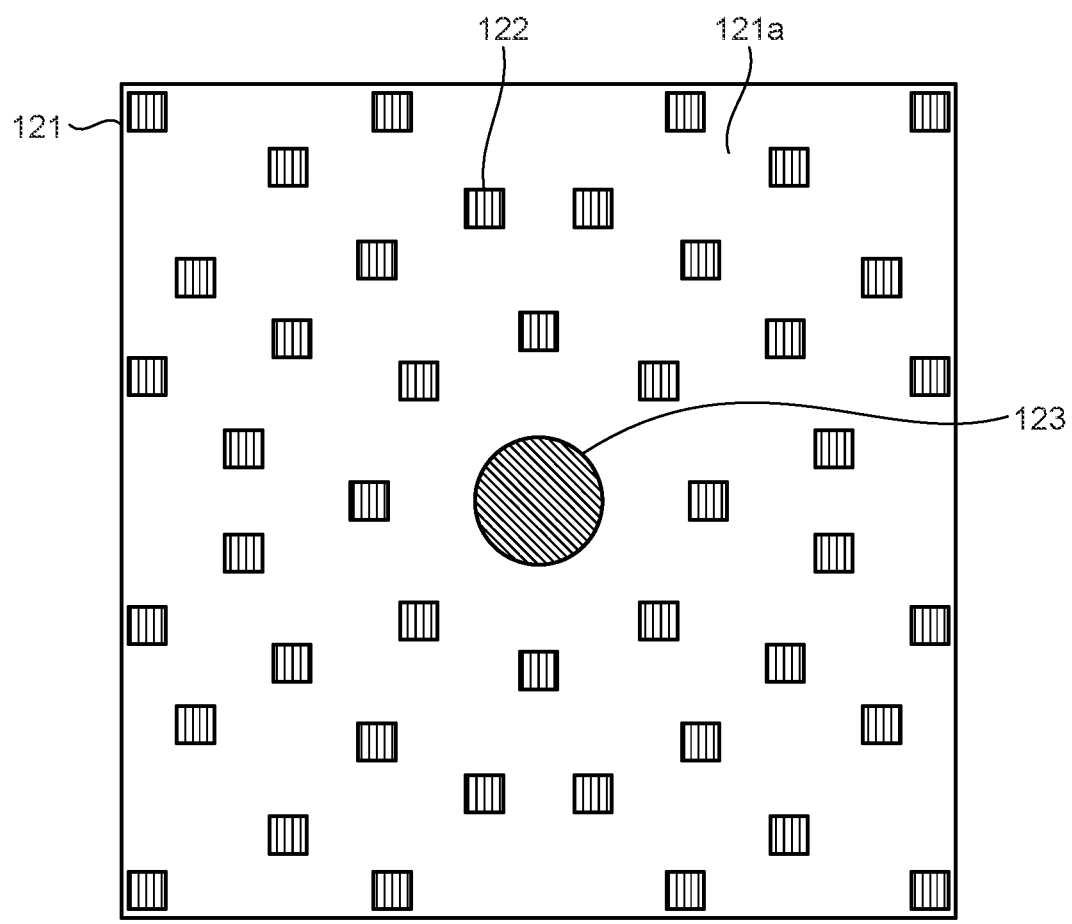
FIG. 10 is a plan view illustrating another specific example of the structure of a die pad.

For example, as illustrated in FIG. 10, the protrusions 122 may be concentrically arranged. The density of the protrusions 122 may be reduced at the central portion of the bottom surface 121a, and the concavity 123 may be formed at the central portion of the bottom surface 121a. Similarly, by adjustment of the density of the remaining portions of the DFR 210, it is possible to form the concavity 123 at the peripheral portion and the central portion of the bottom surface 121a or to form the concavity 123 at four corners of the bottom surface 121a.

Figure 11A:
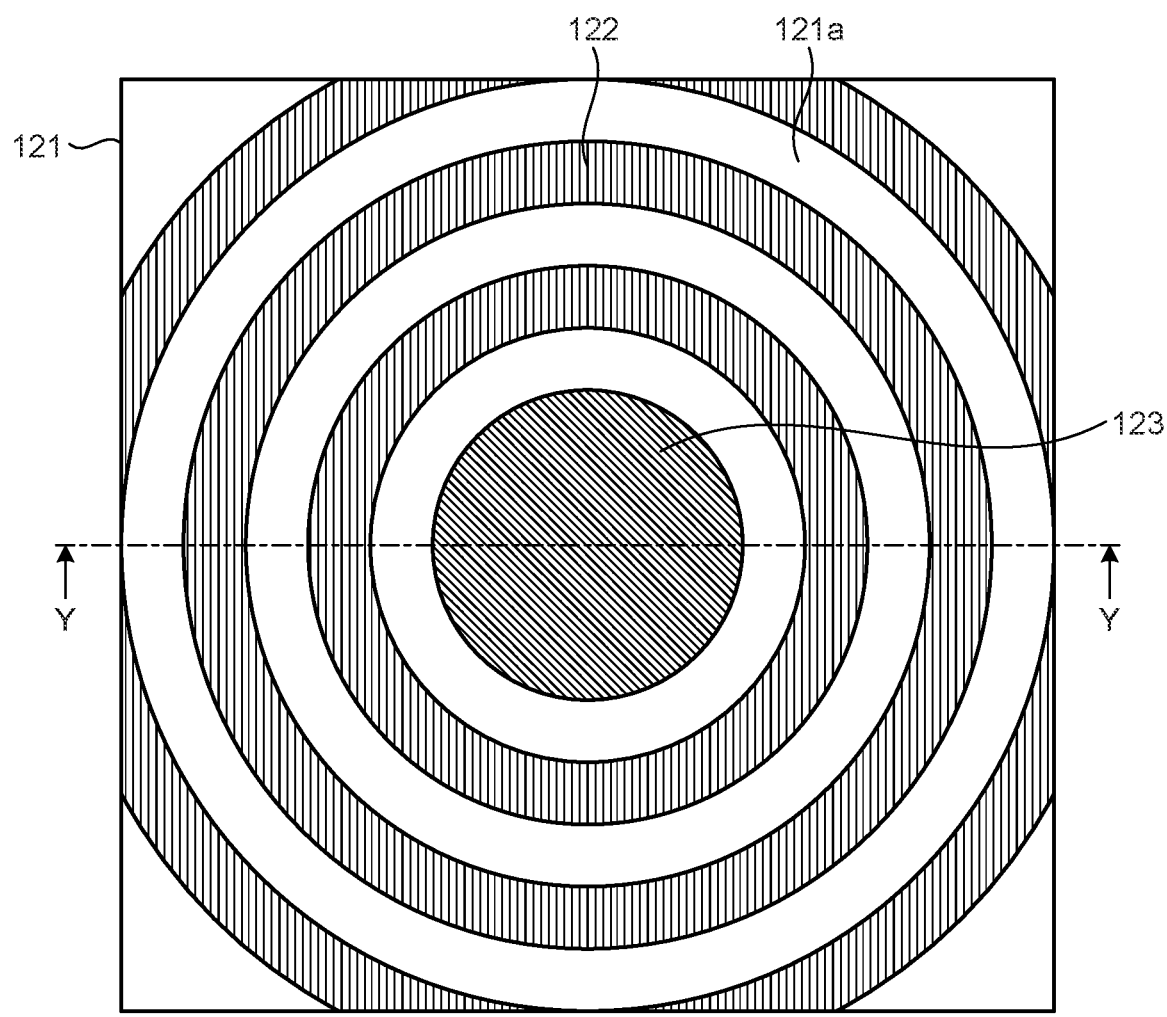
FIGS. 11A and 11B are diagrams illustrating another specific example of the structure of a die pad.
Figure 11B:
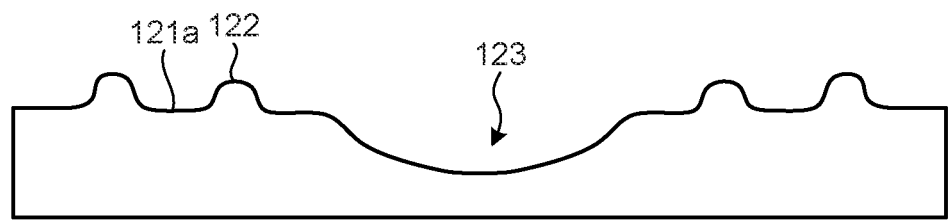

Furthermore, for example as illustrated in FIG. 11A, a plurality of protrusions 122 that is concentric and continuously protrudes in a circular shape may be arranged, and a concavity 123 may be formed at the central portion of the bottom surface 121a. Also in this case, a cross section taken along line Y-Y in FIG. 11A is as illustrated in FIG. 11B for example, and the protrusions 122 protrude to a position higher than the bottom surface 121a of the recess 121, and the concavity 123 is recessed to a position lower than the bottom surface 121a of the recess 121.

Figure 12A:
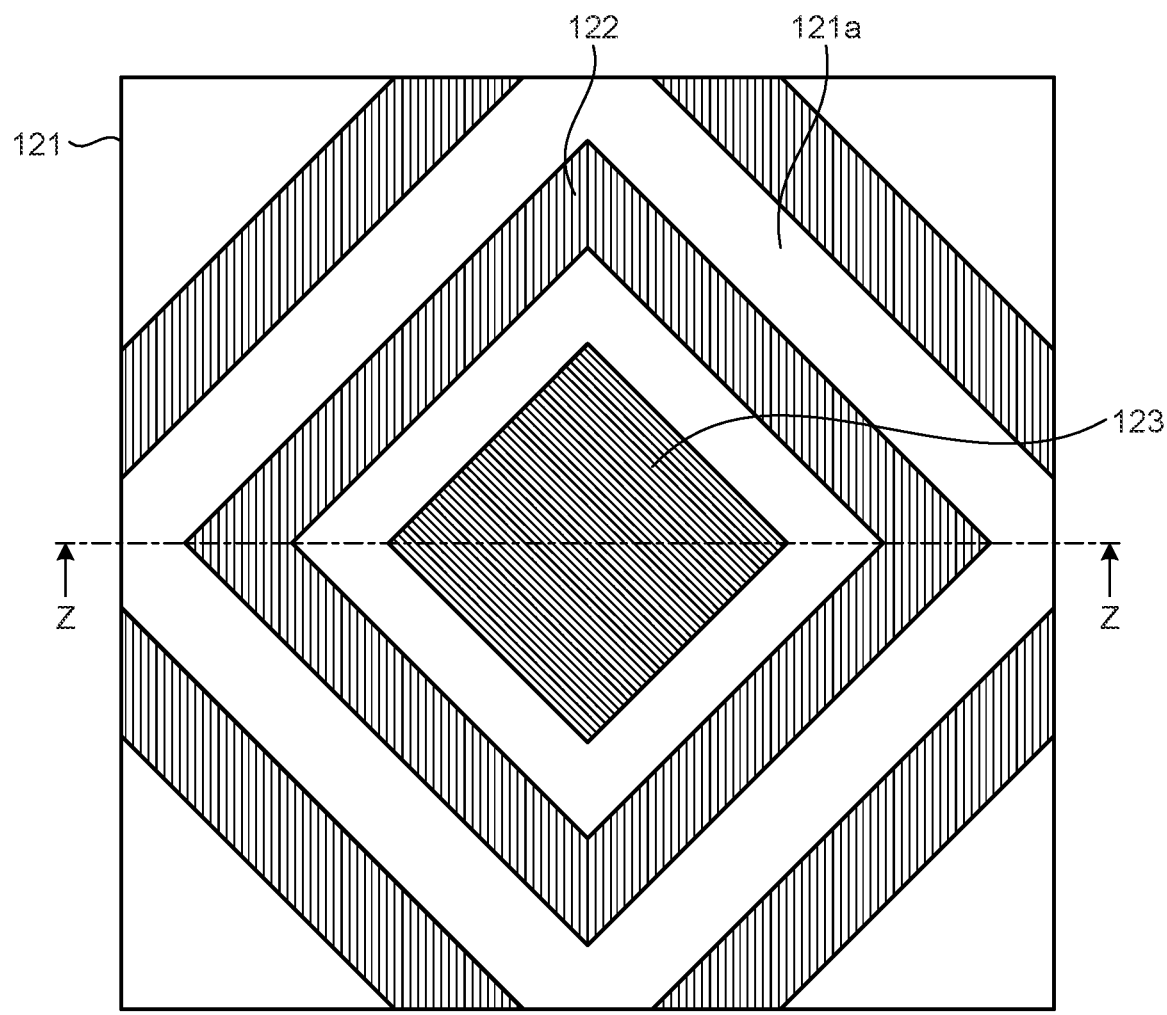
FIGS. 12A and 12B are diagrams illustrating another specific example of the structure of a die pad.
Figure 12B:
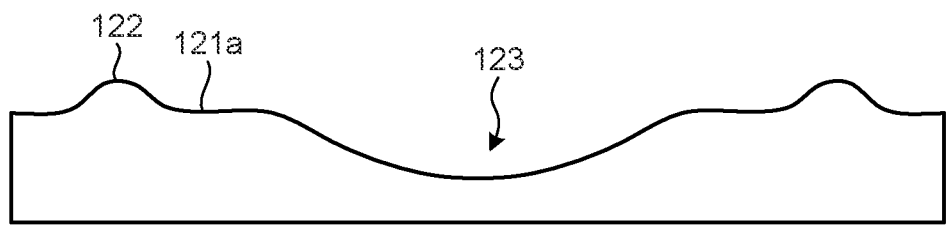

Furthermore, for example as illustrated in FIG. 12A, a plurality of protrusions 122 that is concentric and continuously protrudes in a square shape may be arranged, and a concavity 123 may be formed at the central portion of the bottom surface 121a. Also in this case, a cross section taken along line Z-Z in FIG. 12A is as illustrated in FIG. 12B for example, and the protrusions 122 protrude to a position higher than the bottom surface 121a of the recess 121, and the concavity 123 is recessed to a position lower than the bottom surface 121a of the recess 121.

Figure 13:
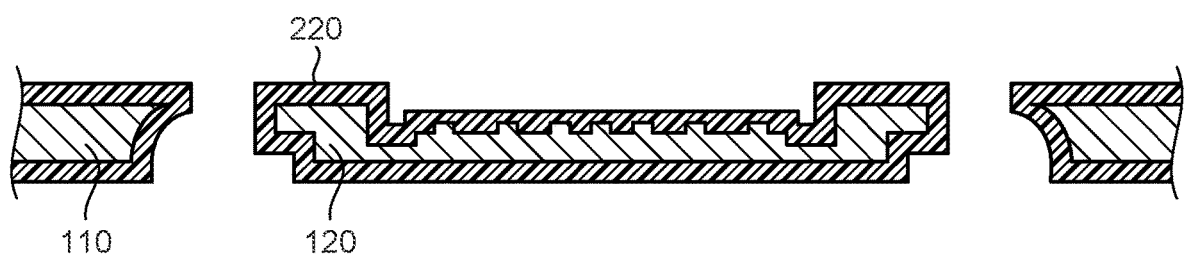
FIG. 13 is a diagram illustrating a specific example of a resist application step.

The molded lead frame 100 is subjected to a pretreatment for washing residues and the like of the DFR 210, and then a resist for plating is applied to the surface of the leads 110 (step S106). Specifically, for example as illustrated in FIG. 13, a resist 220 is applied to the entire surfaces of the leads 110 and the die pad 120.

Figure 14:
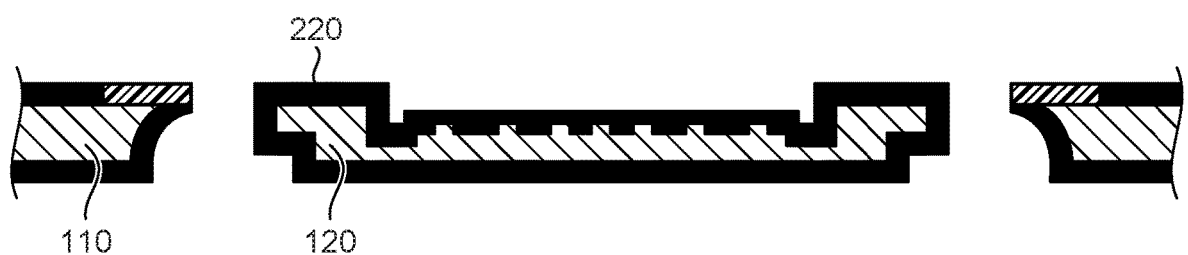
FIG. 14 is a diagram illustrating a specific example of an exposure step.

Then, a mask is formed on the surface of the resist 220 to match plating target portions of the leads 110, and exposure is performed, thereby the resist 220 is cured in the portions where the mask is not formed (step S107). Specifically, for example as illustrated in FIG. 14, the resist 220 other than parts (wire bonding portions) of the upper sides of leads 110 are cured. Note that, in FIG. 14, portions of the resist 220 that are cured by exposure are illustrated in black. The portions of the resist 220 that are cured by exposure become the remaining portions that remain after development.

Figure 15:
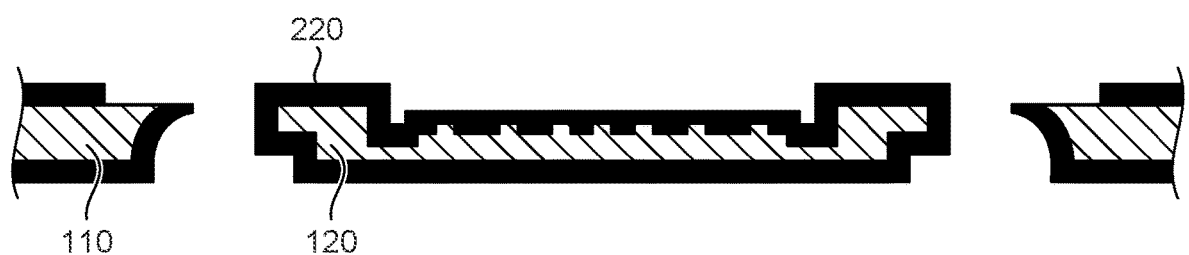
FIG. 15 is a diagram illustrating a specific example of a developing step.

When the resist 220 is cured by exposure, the resist 220 is developed (step S108), and only the remaining portions that are cured remain on the surface of the lead frame 100. That is, for example as illustrated in FIG. 15, the remaining portions of the resist 220 covers the surface of the lead frame 100, and only parts of the upper sides of the leads 110 are exposed. The lead frame 100 in which only parts of the upper sides of the leads 110 are exposed as described above is immersed in, for example, a plating solution for silver plating and plated (step S109). Specifically, for example, the lead frame 100 is immersed in a plating solution containing silver cyanide and potassium cyanide as main components, and electroplating or electroless plating is performed, thereby forming plating layers 111 on the upper sides of the leads 110.

Figure 16:
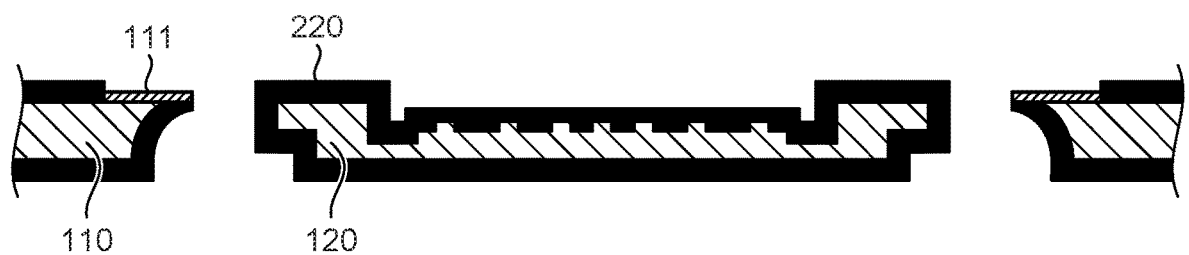
FIG. 16 is a diagram illustrating a specific example of a plating step.
Figure 17:
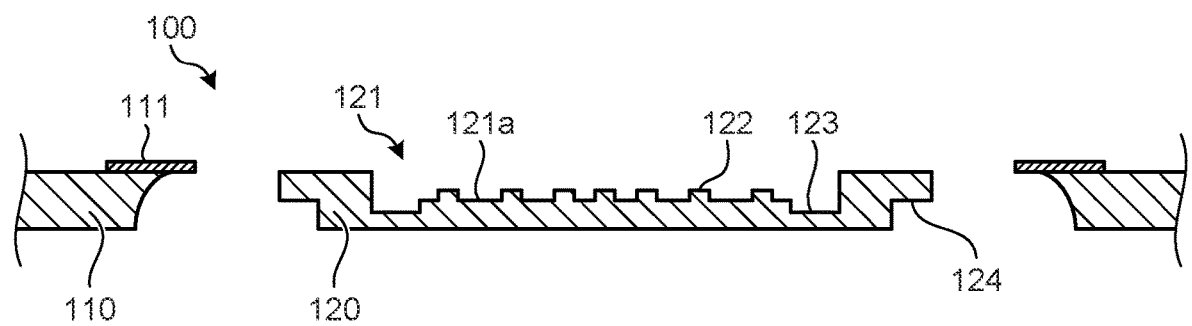
FIG. 17 is a diagram illustrating a specific example of a resist removal step.

That is, for example as illustrated in FIG. 16, silver contained in the plating solution is deposited on parts of the upper sides of the leads 110 that are not covered with the resist 220, and plating layers 111 having a thickness of, for example, 0.1 to 10 μm are formed. When the plating layer 111 is formed, the resist 220 is removed using, for example, a removal solution (step S110), and post-processing is performed, whereby the lead frame 100 is completed. That is, for example as illustrated in FIG. 17, the lead frame 100 is completed in which the plating layers 111 are formed on the upper sides of the leads 110, and the recess 121 having the protrusions 122 and the concavity 123 is formed at the center of the die pad 120.

As described above, at the time of etching to separate the leads 110 and the die pad 120, the recess 121 is formed by half etching of the die pad 120, and the protrusions 122 and the concavity 123 are formed on the bottom surface 121a of the recess 121. Therefore, it is possible to form the recess 121 for preventing the bonding material from flowing out to the periphery of the die pad 120 without increasing the number of steps of forming the lead frame 100. In other words, it is possible to prevent the bonding material from flowing out while avoiding complication of the forming step. It is also possible to form the protrusions 122 for improving adhesion between the bonding material and the bottom surface 121a of the recess 121 and to form the concavity 123 for accommodating the bonding material that is in excess.

Next, the steps of mounting a semiconductor element on the lead frame 100 and manufacturing a semiconductor device will be described.

Figure 18:
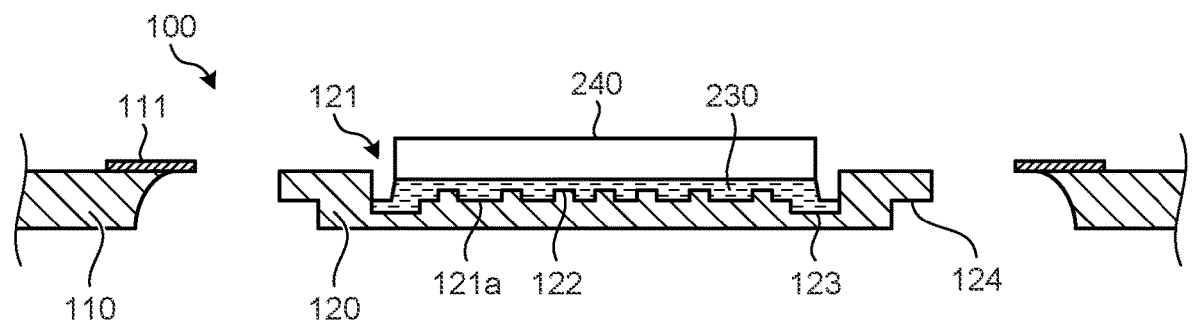
FIG. 18 is a diagram for describing how to mount a semiconductor element.

The semiconductor element is mounted on the die pad 120 of the lead frame 100. Specifically, for example as illustrated in FIG. 18, a semiconductor element 240 is bonded in the recess 121 of the die pad 120 by a bonding material 230 such as solder or die attach paste. At this time, since the protrusions 122 are formed on the bottom surface 121a of the recess 121, the adhesion between the bonding material 230 and the bottom surface 121a is improved, and the semiconductor element 240 can be reliably bonded to the die pad 120. In addition, since the semiconductor element 240 is bonded in the recess 121, the bonding material 230 that is fluid does not flow out to the periphery of the die pad 120 at the time of bonding. Furthermore, even in a case where the bonding material 230 is excessively supplied, the bonding material that is in excess is accommodated in the concavity 123, and the bonding material 230 does not overflow to the outside of the recess 121.

Figure 19:
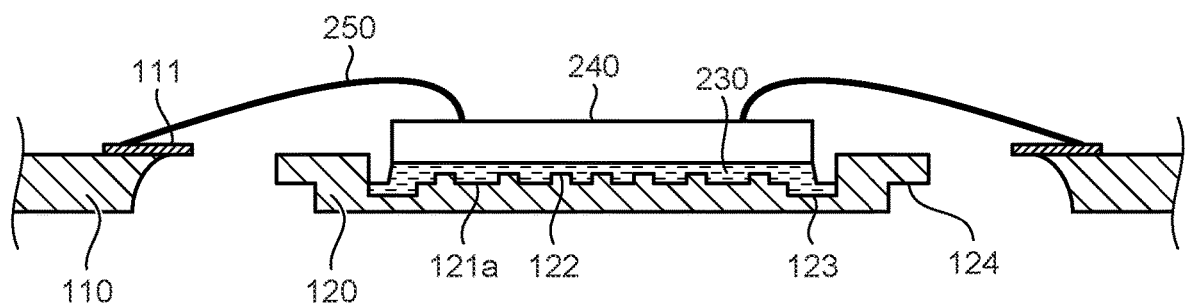
FIG. 19 is a diagram for describing wire bonding.

When the semiconductor element 240 is bonded to the die pad 120, for example as illustrated in FIG. 19, the semiconductor element 240 and the leads 110 are coupled by wire bonding. That is, the electrodes of the semiconductor element 240 are electrically coupled with the plating layers 111 of the leads 110 by wire 250. At this time, since the bonding material 230 has not flowed out from the recess 121, the wire bonding connection is not hindered. In addition, since the semiconductor element 240 is mounted in the recess 121, the height of the upper side of the semiconductor element 240 is close the height of the plating layers 111 of the leads 110. Moreover, the thickness of the semiconductor device can be reduced, and at the same time, the length of the wire 250 can be shortened.

Figure 20:
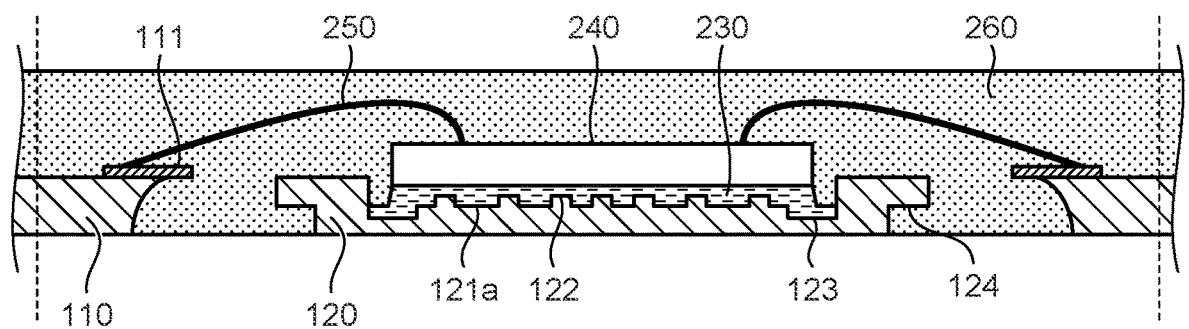
FIG. 20 is a diagram for describing molding.

Then, molding for encapsulating the semiconductor element 240 mounted on the lead frame 100 with an encapsulating resin is performed. Specifically, the lead frame 100 on which the semiconductor element 240 is mounted is accommodated in a mold, and the encapsulating resin that is fluidized is injected into the mold. Here, epoxy resin, for example, may be used as the encapsulating resin. Then, the encapsulating resin is heated to a predetermined temperature and cured, whereby a space around the semiconductor element 240 is filled with the encapsulating resin 260, and the semiconductor element 240 mounted on the lead frame 100 is encapsulated, for example as illustrated in FIG. 20. At this time, since the flange 124 is formed on the die pad 120, the encapsulating resin 260 is filled up to the notch portion below the flange 124, and the bonding strength between the lead frame 100 and the encapsulating resin 260 is improved. That is, it is possible to reduce the possibility that the lead frame 100 falls off from the encapsulating resin 260.

Figure 21:
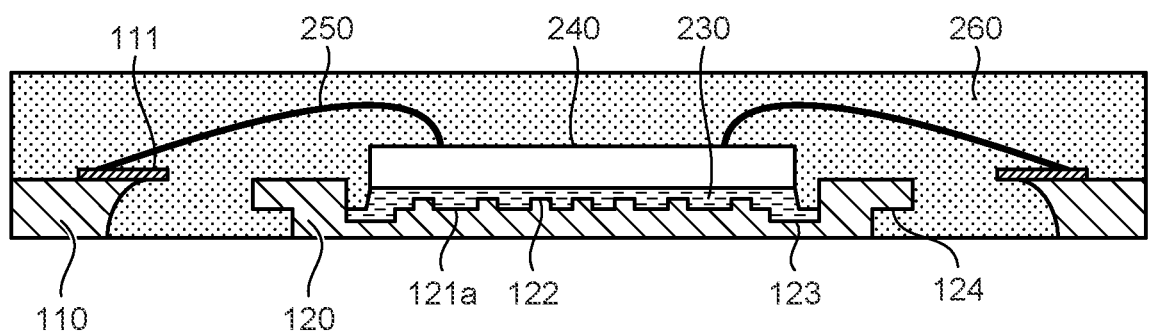
FIG. 21 is a diagram illustrating the structure of a semiconductor device.

When the semiconductor element 240 mounted on the lead frame 100 is encapsulated with the encapsulating resin 260, the encapsulating resin 260 is cut, and the leads 110 and the coupling portions 130 are cut off from the frame body F at a broken line part illustrated in FIG. 20. As a result, the frame body F is separated and removed from the lead frame 100, and a semiconductor device including the leads 110, the die pad 120, the semiconductor element 240, and the encapsulating resin 260 is completed for example as illustrated in FIG. 21. In this semiconductor device, the lower side of the leads 110 and the side surfaces cut from the frame body F are exposed from the lower side and the side surfaces of the encapsulating resin 260 and serve as terminals for coupling to the outside. Furthermore, the lower side of the die pad 120 is exposed from the lower side of the encapsulating resin 260.

As described above, according to the present embodiment, when the leads and the die pad are separated by etching of the metal plate, the center of the die pad is half-etched to form the recess, and the density of the DFR in the area of the recess is adjusted to form the protrusions and the concavity on the bottom surface. Therefore, it is possible to form the lead frame having the recess at the center of the die pad and the protrusions and the concavity on the bottom surface of the recess without increasing the number of steps. As a result, by mounting the semiconductor element in the recess of the die pad, the bonding material for bonding the semiconductor element does not flow out from the recess to the periphery. In other words, it is possible to prevent the bonding material from flowing out while avoiding complication of the forming step. It is also possible to improve the adhesion of the bonding material by the protrusions formed on the bottom surface of the recess and to accommodate the bonding material that is in excess by the concavity formed on the bottom surface of the recess.

With respect to the embodiments and the variety thereof described above, the following notes are further disclosed.

(Note 1) A manufacturing method of a lead frame, the method comprising the steps of:

forming, on a metal plate, a first area in which neither of sides is covered with a resist and a second area in which one of the sides is covered with a resist and another side is covered with a plurality of resists that is interspersed; and by etching the metal plate having the first area and the second area, separating a lead and a die pad by the first area and forming a recess having a plurality of protrusions on a bottom surface in the second area in the die pad.

(Note 2) The manufacturing method of a lead frame according to Note 1, wherein the step of forming the first area and the second area comprises:

forming a second area in which a part of the another side is covered with resists interspersed at a first density and another part of the another side is covered with resists interspersed at a second density lower than the first density, and the step of etching includes:

forming the recess in the die pad, the recess having a concavity recessed deeper than the bottom surface in the another part of the second area.

(Note 3) The manufacturing method of a lead frame according to Note 1, wherein the step of forming the first area and the second area includes:

further forming a third area in which only the another side is covered with a resist; and the step of etching includes:

forming, in the die pad, a flange protruding from an outer periphery of the recess toward the lead in the third area.

According to one aspect of a lead frame, a semiconductor device, and a manufacturing method of a lead frame disclosed in the present application, it is possible to achieve the effect of preventing a bonding material from flowing out while avoiding complication of the forming step.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A lead frame comprising:
a die pad having a mounting surface on which a semiconductor element is mounted;
a recess included on the mounting surface; and
a lead disposed around the die pad,
wherein the recess comprises:
a bottom surface positioned at a depth less than a thickness of the die pad from an opening plane of the recess;
a plurality of protrusions protruding from the bottom surface to a position higher than the bottom surface; and
a concavity recessed from the bottom surface to a position lower than the bottom surface, and
the plurality of protrusions are located more inside than a periphery of the bottom surface.

2. The lead frame according to claim 1,
wherein the plurality of protrusions are formed at a first density on a part of the bottom surface and formed at a second density lower than the first density on another part of the bottom surface, and
the concavity is formed at the another part of the bottom surface.

3. The lead frame according to claim 2,
wherein the plurality of protrusions are formed at a higher density as it is closer to a center of the bottom surface, and
the concavity is formed at a periphery of the bottom surface.

4. The lead frame according to claim 2,
wherein the plurality of protrusions are concentrically arranged such that a density of the plurality of protrusions is reduced at a central portion of the bottom surface, and
the concavity is formed at the central portion of the bottom surface.

5. The lead frame according to claim 2,
wherein the plurality of protrusions are concentric and continuously protrude in a circular shape, and
the concavity is formed at a central portion of the bottom surface.

6. The lead frame according to claim 2,
wherein the plurality of protrusions are concentric and continuously protrude in a square shape, and
the concavity is formed at a central portion of the bottom surface.

7. The lead frame according to claim 1,
wherein each of the plurality of protrusions has an end at a position where a depth from the opening plane of the recess is shallower than a depth of the bottom surface.

8. The lead frame according to claim 1,
wherein the concavity is recessed to a position where a depth from the opening plane of the recess is deeper than a depth of the bottom surface.

9. The lead frame according to claim 1,
wherein the die pad further comprises:
a flange formed on an outer circumference of the recess and protruding toward the lead.

10. The lead frame according to claim 1,
wherein the lead comprises:
a plating layer formed on a surface on a same side as the mounting surface.

11. A semiconductor device comprising:
a lead frame;
a semiconductor element mounted on the lead frame; and
an encapsulating resin encapsulating the semiconductor element,
wherein the lead frame comprises:
  a die pad having a mounting surface on which the semiconductor element is mounted;
  a recess included on the mounting surface; and
  a lead disposed around the die pad, and
the recess comprises:
  a bottom surface positioned at a depth less than a thickness of the die pad from an opening plane of the recess;
  a plurality of protrusions protruding from the bottom surface to a position higher than the bottom surface; and
  a concavity recessed from the bottom surface to a position lower than the bottom surface, and
the plurality of protrusions are located more inside than a periphery of the bottom surface.

12. The semiconductor device according to claim 11,
wherein the plurality of protrusions are formed at a first density on a part of the bottom surface and formed at a second density lower than the first density on another part of the bottom surface, and
the concavity is formed at the another part of the bottom surface.

13. The semiconductor device according to claim 12,
wherein the plurality of protrusions are formed at a higher density as it is closer to a center of the bottom surface, and
the concavity is formed at a periphery of the bottom surface.

14. The semiconductor device according to claim 12,
wherein the plurality of protrusions are concentrically arranged such that a density of the plurality of protrusions is reduced at a central portion of the bottom surface, and
the concavity is formed at the central portion of the bottom surface.

15. The semiconductor device according to claim 12,
wherein the plurality of protrusions are concentric and continuously protrude in a circular shape, and
the concavity is formed at a central portion of the bottom surface.

16. The semiconductor device according to claim 12,
wherein the plurality of protrusions are concentric and continuously protrude in a square shape, and
the concavity is formed at a central portion of the bottom surface.

17. The semiconductor device according to claim 11,
wherein each of the plurality of protrusions has an end at a position where a depth from the opening plane of the recess is shallower than a depth of the bottom surface.

18. The semiconductor device according to claim 11,
wherein the concavity is recessed to a position where a depth from the opening plane of the recess is deeper than a depth of the bottom surface.

19. The semiconductor device according to claim 11,
wherein the die pad further comprises:
a flange formed on an outer circumference of the recess and protruding toward the lead.

20. The semiconductor device according to claim 11,
wherein the lead comprises:
a plating layer formed on a surface on a same side as the mounting surface.

* * * * *